United States Patent [19]

Hogan et al.

[11] Patent Number: 5,938,848
[45] Date of Patent: *Aug. 17, 1999

[54] METHOD AND CONTROL SYSTEM FOR APPLYING SOLDER FLUX TO A PRINTED CIRCUIT

[75] Inventors: Patrick T. Hogan, Lorain; Kenneth Zalewski, Euclid; John P. Byers, Avon Lake; James Powell, Mentor; Drew Roberts, Concord; Richard G. Christyson, Lakewood, all of Ohio

[73] Assignee: Nordson Corporation, Westlake, Ohio

[ * ] Notice: This patent issued on a continued prosecution application filed under 37 CFR 1.53(d), and is subject to the twenty year patent term provisions of 35 U.S.C. 154(a)(2).

[21] Appl. No.: 08/672,098

[22] Filed: Jun. 27, 1996

[51] Int. Cl.⁶ ........................................ B05B 15/02
[52] U.S. Cl. .................... 118/682; 118/679; 118/712; 118/324
[58] Field of Search ................... 118/669, 676, 118/679, 696, 706, 324, 682, 686, 693, 673; 228/102, 103, 8, 10, 223; 427/96, 424, 8

[56] References Cited

U.S. PATENT DOCUMENTS

| | | | |
|---|---|---|---|
| 4,164,001 | 8/1979 | Patnaude | 118/684 |
| 4,419,384 | 12/1983 | Kane et al. | 118/669 |
| 5,217,745 | 6/1993 | Patel | 118/689 |
| 5,368,219 | 11/1994 | Hogan et al. | 228/33 |
| 5,415,337 | 5/1995 | Hogan et al. | 228/223 |
| 5,534,067 | 7/1996 | Fulker et al. | 118/680 |

FOREIGN PATENT DOCUMENTS

| | | |
|---|---|---|
| 31 48 541 | 8/1981 | Germany . |
| WO 94/04305 | 8/1992 | WIPO . |

*Primary Examiner*—David A. Simmons
*Assistant Examiner*—Calvin Padgett
*Attorney, Agent, or Firm*—Calfee, Halter & Griswold LLP

[57] ABSTRACT

A first embodiment includes a control system which operates a spray gun to apply an even coating of flux to a circuit board or a plurality of different length circuit boards irrespective of the speed that the circuit board(s) move through a coating chamber. In a second embodiment, the control system pulses the spray gun on and off with a pulsing pattern that coats a plurality of zones of a circuit board with spray patterns of different length and thickness.

11 Claims, 2 Drawing Sheets

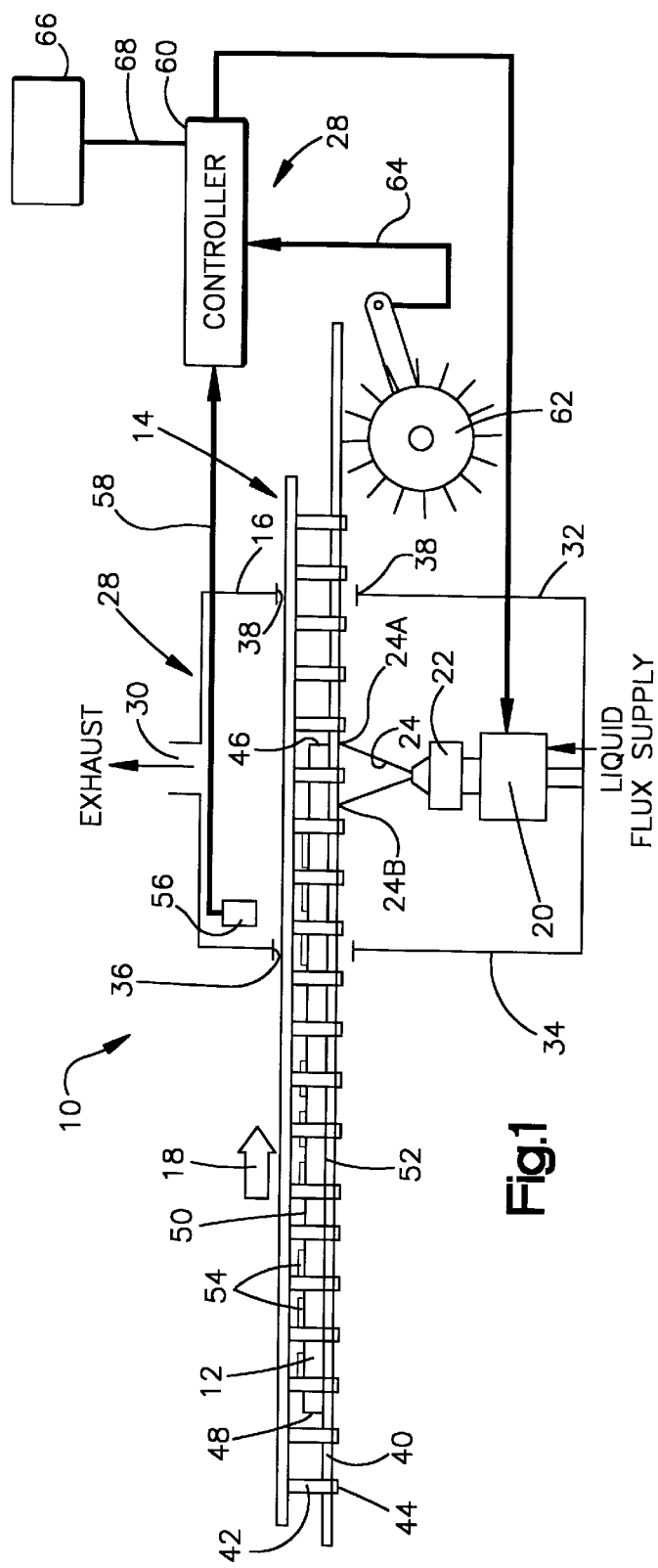
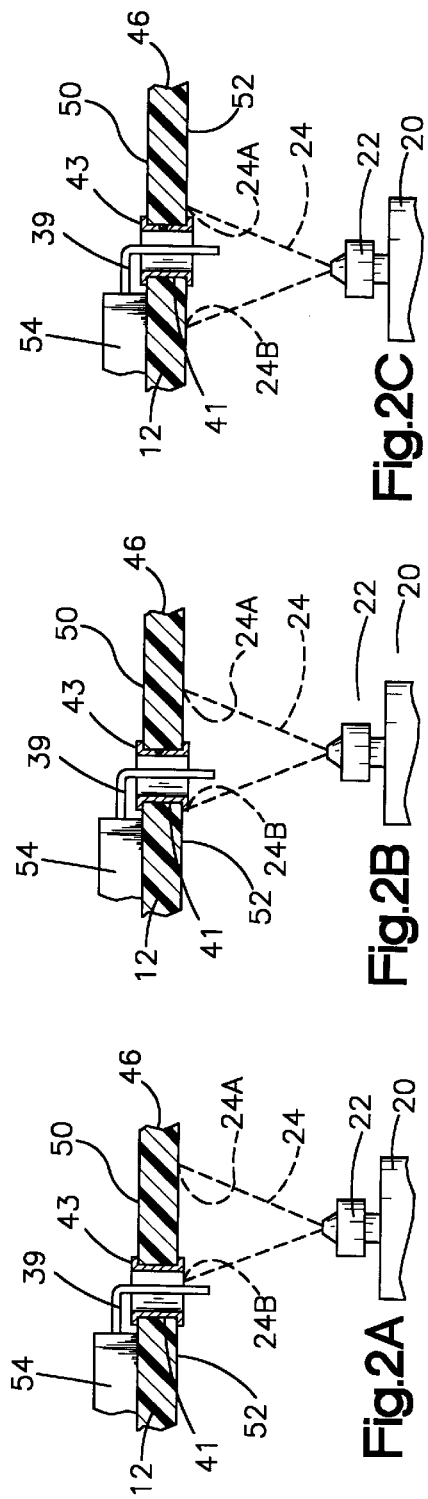
Fig.1
Fig.2A  Fig.2B  Fig.2C

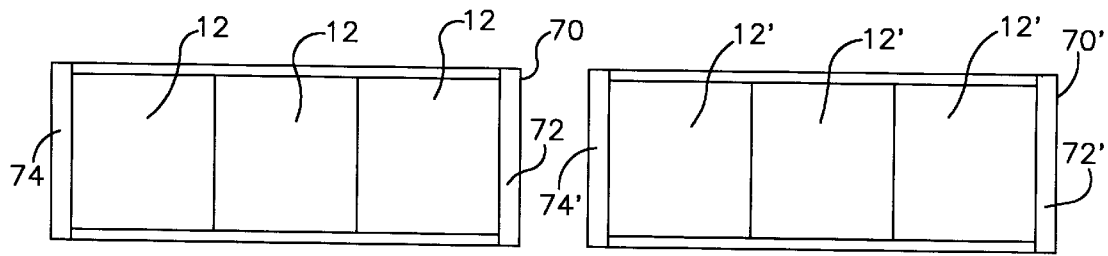
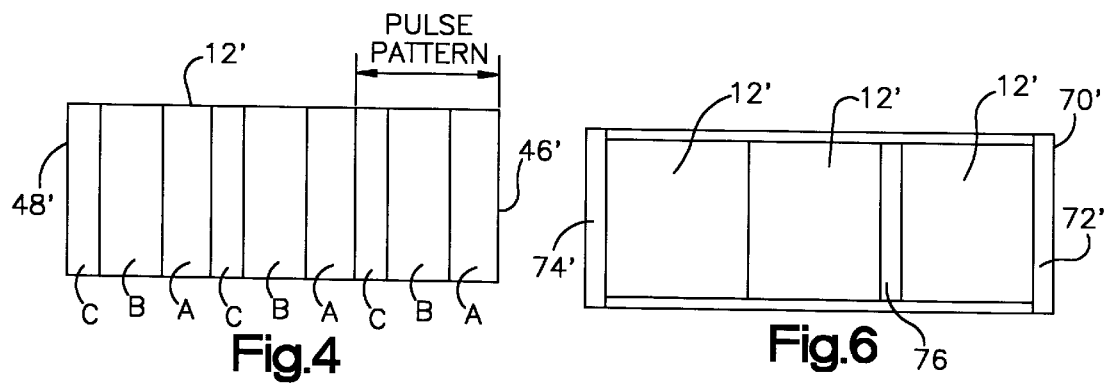
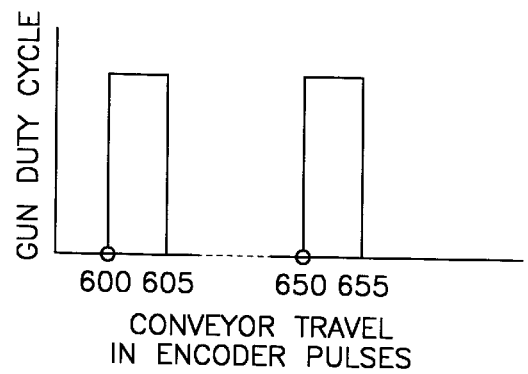
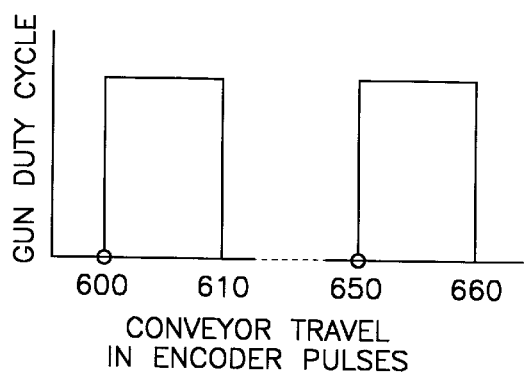
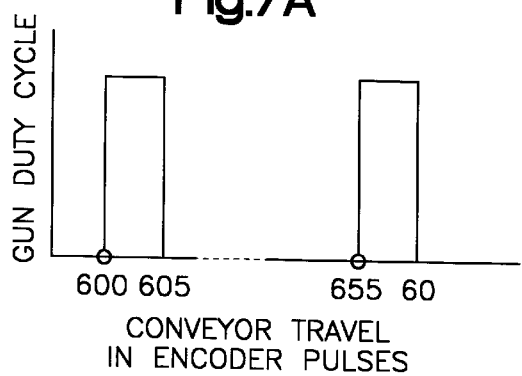
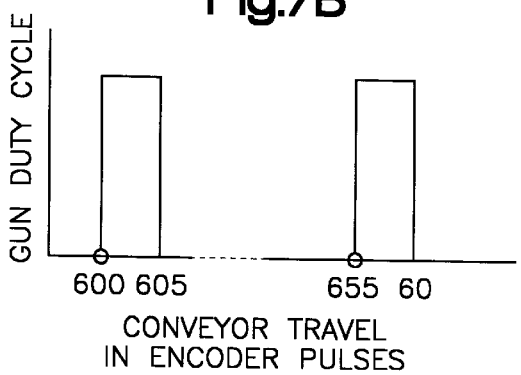

METHOD AND CONTROL SYSTEM FOR APPLYING SOLDER FLUX TO A PRINTED CIRCUIT

FIELD OF THE INVENTION

This invention relates to the field of fabricating printed circuit boards and more particularly to a method and control system for applying solder flux to the circuit boards with a spray gun prior to soldering leads of circuit components to the board.

BACKGROUND OF THE INVENTION

The production of circuit boards typically includes loading the circuit boards onto a conveyor line and transferring them down the conveyor line to a station where the leads of electrical components are inserted into the holes through the circuit board by a machine and/or manually. The boards are then transferred to an edge handling conveyor which transfers the boards through a flux application station where solder flux is applied to the circuit boards so that the leads of the electrical components can later be soldered to the metallized areas of the board with a high quality solder bond. After moving through the flux application station, the boards are transferred through a preheat zone to flash off the solvents from the flux and to preheat the board to minimize thermal shock from contact with solder wave. Continuing the process, the board is transported through a wave solder machine where the board moves over a wave of solder. The solder is drawn or forced up into through-holes containing the leads of the electrical components and solder bonds between the leads and the metallized sections of the board are formed. After leaving the wave solder machine, the board is sent through a cleaning machine to remove the residue left from the flux, if necessary. The effectiveness of the flux application, the type of flux being applied, the need to clean the board subsequent to soldering, and the need to clean the coating chamber in which the solder flux is applied, each present problems which are addressed by the present invention.

As described in U.S. Pat. No. 5,415,337, assigned to Nordson Corporation of Westlake, Ohio, the assignee of the present invention, which is incorporated in its entirety herein, low-solid fluxes, or "no-clean fluxes", which contain small amounts, e.g., about 1% to 5% by weight of solids (activator and vehicle) and the remainder liquid solvent, such as isopropyl alcohol, are being increasingly used by circuit board manufacturers in an effort to eliminate the need to clean the circuit boards after soldering. Because of the small amount of solids within no-clean fluxes, the amount of residue left on the board is significantly reduced, as compared to the amount of residue remaining after the use of conventional rosin-based fluxes. These low-solid, no clean fluxes are particularly attractive because, as their name implies, and flux cleaning of the circuit boards after soldering is not required, which results in a significant cost savings.

The application of the no-clean fluxes using the control system described in U.S. Pat. No. 5,415,337 has sometimes lead to problems because the controller is difficult to program for boards of varying length, for boards requiring more than one spray profile, for varying speeds of the conveyor, for multiple boards carried on pallets, and for spraying selected sections of the boards.

The problem with the control system described in U.S. Pat. No. 5,415,337 is that the control system does not always initiate the spray cycle for boards or sometimes initiates the spray cycle when a board is not in place. The latter problem generates overspray within the coating chamber. This overspray wastes flux coating material and results in the chamber and the conveyor becoming covered with the flux coating material and being difficult and time consuming to clean. Also, the overspray tends to clog up the control sensor which signals the location of the circuit board to the control system. This is detrimental because the spray is then turned on when the board is not in the proper location. This exacerbates the problem by generating even more overspray and creating an even greater mess which requires more frequent cleaning. Whenever the system is cleaned, the entire line must be shutdown, further increasing the overall manufacturing costs of the circuit boards.

Therefore, there is a need for an easily programmed controller able to control a spray gun for applying solder fluxes, and particularly low-solid fluxes, to circuit boards so that an even coating of the solder flux is applied to the entire board irrespective of the speed of the conveyor line or the length of the board. In addition, there is a need for a controller able to control a gun for applying coatings of varying length and thickness to different zones of a single board.

OBJECTS AND SUMMARY OF THE INVENTION

It is an object of the present invention to provide a system and method for applying a flux coating to a circuit board which obviates the problems and limitations of the prior art systems.

It is a further object of the present invention to provide a system and method for applying an even solder flux oating to a circuit board irrespective of the speed of the circuit board through the coating chamber.

Yet another object is to provide a system and method for applying an even coating of solder flux coating to a plurality of different length circuit boards moving down a conveyor line.

Still another object is to provide a system and method for applying a flux coating to a circuit board with a pulsing pattern that pulses a spray gun on and off to coat a plurality of zones of a circuit board with different spray patterns.

In accordance with a first embodiment of the invention, a control system for controlling the application of a coating material to a substrate, such as a circuit board, and the method of operating the control system includes a conveyor for transporting the substrate in a direction of travel. A spray gun emits a spray pattern of coating material. An encoder disposed adjacent the conveyor outputs encoder pulse signals corresponding to the distance of travel of the conveyor. A sensor disposed adjacent the conveyor and upstream of the spray gun a first distance senses the length of the substrate on the conveyor and outputs a length signal corresponding to a second distance between the leading edge and trailing edge of the substrate. A controller which is operatively connected to the spray gun, the encoder and the sensor, is activated in response to the length signal from the sensor to output a recurring sequence of trigger signals for pulsing the spray gun on for a period of time and for a distance of travel to apply a relatively even coating of material to the substrate irrespective of the speed of the conveyor or the length of the board.

In a second embodiment of the invention, the control system and method of operating the control system includes a controller that outputs a recurring sequence of trigger signals for pulsing the spray gun on for a period of time and for a distance of travel to apply coating of material at different rates to different regions of the substrate.

BRIEF DESCRIPTION OF THE DRAWINGS

The structure, operation, and advantages of the presently preferred embodiment of the invention will become further apparent upon consideration of the following description taken in conjunction with the accompanying drawings, wherein:

FIG. 1 is a side, elevational schematic illustration of a system for applying a flux coating with an airless spray gun operated by an improved controller onto a circuit board being transported by a conveyor through a coating chamber, in accordance with the invention;

FIGS. 2A, 2B, and 2C show the position of the spray gun with respect to the underside of a circuit board shown in cross section at three consecutive on pulses of the gun; and FIG. 3 shows a plan view of a plurality of circuit boards carried on a pallet;

FIG. 4 shows a plan view of a circuit board sprayed by a pulse pattern having three zones of different length receiving different amounts of spray;

FIG. 5 shows a plan view of a plurality of circuit boards carried on a pallet with each board being sprayed by a pulse pattern having three zones of different length receiving different amounts of spray;

FIG. 6 shows a plan view of a plurality of circuit boards carried on a pallet a vacant space between two of the boards;

FIGS. 7A and 7B show encoder correlated plots of spray gun actuation for the present invention; and FIGS. 7C and 7D show encoder correlated plots of spray gun actuation for the prior art controller.

DETAILED DESCRIPTION OF THE INVENTION

Referring to FIG. 1, there is shown a schematic illustration of system 10 for applying a flux coating to a substrate such as a circuit board 12. System 10 includes a conveyor 14 for transporting circuit board 12 through a flux coating chamber 16 in a direction of travel indicated by arrow 18. A spray gun 20 having a nozzle 22 is disposed within coating chamber 16 and emits a liquid spray pattern 24 from nozzle 22. A control system 26 is operatively connected to spray gun 20 for intermittently pulsing gun 20 on and off to coat overlapping sections of the undersurface of circuit board 12 in response to circuit board 12 moving a predetermined distance through coating chamber 16. An overspray collection system 28, located within coating chamber 16, collects oversprayed flux and exhausts it through a vent 30 from coating chamber 16.

As in the prior art, flux coating chamber 16 is located between an assembly station (not shown), where circuit components 54 are mounted on circuit board 12 with their leads 39 inserted into through-holes 41 extending through board 12, as shown in FIGS. 2A, 2B, and 2C, and a preheat station (not shown) directly downstream from coating chamber 16 where the board, subsequent to being coated with a solder flux, is heated to a predetermined temperature which prevents damage from a high thermal gradient created when the board is passed through a conventional wave solder machine (not shown).

Flux coating chamber 16 is formed with a front wall 32, and a rear wall 34 provided with an inlet opening 36 and an outlet opening 38, respectively, through which conveyor 14 passes. Conveyor 14 includes spaced coplanar conveyor chains 40 (only one being illustrated) which move in the direction of travel 18. Chains 40 each carry a plurality of equally spaced tabs 42, each with a finger 44 at its bottom which projects inwardly from the chain to which it is secured so as to point towards the fingers associated with the tabs (not shown) carried by the other chain (not shown). Fingers 44 serve to engage opposite edges of circuit board 12. The chains 40 are driven jointly, by a variable-speed electric motor (not shown). When chains 40 are driven in the direction indicated by the arrow 18, each circuit board 12 is carried through the flux coating chamber 16 and sprayed with a liquid spray pattern 24 dispensed by nozzle 22 of spray gun 20. After leaving flux chamber 16 through outlet opening 38, each circuit board 12 is transported through a preheat chamber (not shown) and then through the solder wave (not shown) for soldering.

Referring to FIGS. 1, 2A, 2B, and 2C, a conventional circuit board 12 is comprised of a sheet of insulative material, i.e. epoxy resin, having leading and trailing ends 46 and 48, respectively. A plurality of through-holes 41 extend between the coplanar upper surface 50 and undersurface 52 of board 12. Each through-hole 41 is plated with a layer 43 of metal that is joined to a pair of spaced metallized areas (not shown), located on the opposite surfaces 50 and 52. Metal paths (not shown) are provided on one or both of the surfaces 50 and 52 for selectively connecting the metallized areas.

Circuit components 54 are mounted on the upper side 50 of circuit board 12 by means of leads 39 passing through the through-holes 41 and soldered in place to assure a solid mechanical and electrical bond between each lead and the metal layer in each corresponding through-hole. The soldering is preferably done in an automatic fashion, such as by passing the circuit board 12 over a wave of molten solder in a wave soldering machine (not shown) so that the wave of solder contacts the undersurface 52 of the board and is drawn up into each through-hole 41 by wetting forces to bond the leads 39 to the board.

Prior to soldering, solder flux is applied to the undersurface 52 of the circuit board 12 so that during the subsequent soldering operation, the solder will wet the leads 39, the metal layer within the through-holes 41 and the metallized areas. To assure a solid mechanical and electrical bond between the leads 39 and the board 12, flux is preferably sprayed into the through-holes 41 after the leads are already in place.

A principle feature of this invention is the use of a spray gun 20 disposed within coating chamber 16 to apply a coating material such as solder flux, preferably a low-solid, or no-clean flux. While the invention is directed to the application of a flux material, it is within the scope of the invention to apply other types of liquid coating material. The spray gun 20 is an on/off device and sprays the same volume of solder flux for the same time period in which it is open. The spray gun 20 can be a Nordson Model A7A gun equipped with a Nordson Cross-Cut® nozzle, manufactured by Nordson Corporation of Westlake, Ohio, the assignee of the present invention. Spray gun 20 uses a spray coating technique called airless atomization whereby the liquid upstream of the nozzle orifice is hydrostatically pressurized to expand after it exits the nozzle orifice into the air at ambient pressure so that the liquid stream expands and is atomized by the hydraulic force alone. Spray gun 20 is mounted on a gun mounting fixture (not shown) to vary the distance and to center the gun nozzle 22 with respect to undersurface 52 of circuit board 12.

Another aspect of the invention is that the solder flux is pulsed onto the undersurface 52 of board 12 to ensure that the coating is uniformly applied across the undersurface 52 of the board without generating undue overspray. Pulsing in combination with a high pressure spray also ensures effective penetration of through-holes 41 in circuit board 12 because the flux impacts each through-hole in board 12 from more than one angle, since the board is moving and the gun 20 is fixed.

As illustrated in FIG. 1, board 12 is transferred in the direction of arrow 18. Board 12 is sprayed with the solder flux by spray gun 20 which in turn is controlled by control system 26. The control system 26 includes a sensor 56 which is connected to a controller 60 by a line 58. A first distance between the sensor 56 and the nozzle 22 of spray gun 20 is programmed into controller 60. More typically, the first distance is set between sensor 56 and the front edge 24A of spray pattern 24. When the leading end 46 of circuit board 12 passes under sensor 56, the sensor is activated until the trailing edge 48 of the board passes the sensor as the board moves in the direction of travel 18. Sensor 56 outputs a length signal through line 58 to controller 60 corresponding to a second distance equal to the length of board 12. Sensor 56 is positioned upstream from the location of spray gun 20 to prevent overspray from spray gun 20 coating the sensor. Control system 26 includes an encoder 62 disposed adjacent and preferably connected directly to conveyor 14. Encoder 62 outputs a number of encoder pulse (ep) signals to controller 60 through line 64 corresponding to the distance of travel of conveyor 14.

In a first embodiment of the invention, controller 60 accesses a pulsing program from a conventional means, such as a computer 66, through line 68. The pulsing program enables an operator to input, the distance between the sensor 56 and the nozzle 22. If desired, the distance can be measured between the sensor 56 and the position where the forward edge 24A of the spray pattern 24 contacts the underside of board 12. Also, the operator inputs a selected period of time for pulsing spray gun 20 on, and a predetermined number of encoder pulse signals corresponding to the distance between the locations on the circuit board 12 from when the spray gun is pulsed on and then pulsed on again. The predetermined number of encoder pulse signals are counted from whenever the spray gun is pulsed on.

During the operation of the first embodiment, the control system 26, after having the first distance between the sensor 56 and the forward edge 24A of the spray pattern 24, the selected period of time and the predetermined number of encoder pulse signals already inputted into the pulsing program as mentioned above, is activated when a circuit board 12 is moved by conveyor 14 under sensor 56. Sensor 56 is then activated to sense the length of circuit board 12 carried on conveyor 14 and to output a length signal corresponding to a second distance between the leading edge 46 and the trailing edge 48 of the circuit board into line 58. The length signal is inputted into controller 60 which in response thereto outputs a trigger signal for pulsing the spray gun 20 on for the selected period of time after the leading edge 46 of circuit board 12 moves the first distance. Then, after circuit board 12 travels a distance corresponding to the predetermined number of encoder pulse signals counted from when spray gun 20 is pulsed on, controller 60 outputs another trigger signal for the selected period of time and the circuit board 12 moves a distance corresponding to the predetermined number of encoder pulse signals counted from when the latter trigger signal. This sequence of trigger signals is repeated until the circuit board 12 moves a distance corresponding to the length signal being output by the sensor 56 when the controller 60 stops outputting trigger signals until the next circuit board passes under sensor 56 to repeat the sequence again.

A unique aspect of the present invention relates to the benefits of control system 26, i.e., that the circuit board 12 will be coated with the same volume of solder flux per unit length irrespective of the speed of the conveyor 14 or the length of the circuit board. This can be understood by the comparison of the following two examples using arbitrary distances and times.

In example 1 relating to the first embodiment of the present invention, conveyor 14 is set to move at 100 encoder pulses per second (ep/sec). Encoder 62 can be setup so that conveyor 14 moves 1 inch for every 100 encoder pulses (ep). As shown in FIG. 2A and FIG. 7A, spray gun 20 is pulsed on for selected period of time of 50 milliseconds (0.050 sec) after the leading edge 46 of circuit board 12 moves the first distance, for example 600 ep (6 inches), from sensor 56 to the location where the front edge 24A of spray pattern 24 contacts the underside 52 of the board. The spray is thus on 0.050 sec and is repeated every 50 ep while the board moves 0.05 inches. The width of the spray pattern 24, i.e., between side edge 24A and 24B is typically about 1.5 inches in width. Spray pattern 24 is diagrammatically shown to be wider for purposes of illustration. The width of the coating applied to the undersurface of the circuit board 12 in this example is thus 1.55 inches. After the circuit board 12 has moved a distance equal to 50 ep (0.5 inches) from the position of when the gun is initially pulsed on, spray gun 20 is pulsed on again for 0.05 sec and the cycle or sequence repeats every 50 ep. The next spray pulse is pulsed on again and coats a second section for 1.5 inches plus 0.05 inches of board travel which overlaps the first section. Since the side edge of the spray pulse is approximately 1.5 inches in width and since the second spray pulse will be actuated for 0.050 sec at 0.5 inches from the start of the first spray pulse, the first and second sections and will overlap by approximately 1.0 inches.

In example 2 relating to the first embodiment of the present invention, as shown in FIG. 7B, the conveyor is set to move at 200 ep/sec. Encoder 62 remains setup so that conveyor 14 moves 1 inch for every 100 encoder pulses (ep). The spray gun 20 is pulsed on for selected period of time of 50 milliseconds (0.050 sec) after the leading edge 46 of the circuit board 12 moves the first distance, for example 600 ep (6 inches) from sensor 56 to the front edge 24A of spray pattern 24. The spray is thus on while the board moves 0.10 inches. The width of the spray pattern 24, i.e., between side edge 24A and 24B is typically about 1.5 inches in width. The width of the coating applied to the undersurface of the circuit board 12 in this example is thus 1.60 inches. After the circuit board 12 has moved a distance equal to 50 ep (0.50 inches) from the position of when the gun is initially pulsed on, spray gun 20 is pulsed on again for 0.050 sec and the cycle or sequence repeats every 50 ep. The next spray pulse is pulsed on again and coats a second section for 1.5 inches plus 0.10 inches of board travel which overlaps the first section. Since the side edge of the spray pulse is approximately 1.5 inches in width and since the second spray pulse will be actuated for 0.050 sec at 0.5 inches from the start of the first spray pulse, the first and second sections will still overlap by approximately 1.0 inches.

Using the prior art controller as described in U.S. Pat. No. 5,415,337, the controller outputs a trigger signal for pulsing spray gun 20 on for a selected number of encoder pulses and then triggers the spray gun off for a certain number of counts from encoder 128. This continues for a preprogramed distance. The prior art control system will coat circuit board 12 with a different volume of solder flux per unit length depending on the speed of the conveyor. This can be understood by the comparison of the following two examples using arbitrary distances and times similar to those used in describing the first embodiment above.

In a third example relating to the prior art controller, as shown in FIG. 7C, the encoder remains setup so that conveyor moves 1 inch for every 100 encoder pulses (ep) and the conveyor is set to move at a desired speed, such as for example, 100 ep/sec or one inch per second. At this speed, the encoder generates an encoder pulse for every 0.01 inches of conveyor movement. The gun is pulsed open for 5 ep or 0.05 inches of conveyor movement. The period of time that the gun is open is 0.050 seconds. Then the controller closes the gun for 50 ep or 0.5 inches of board movement. The width of the spray pattern between side edge 24A and 24B is 1.5 inches in width. The width of the coating applied to a first section of the undersurface of the circuit board 12 in this example is thus 1.55 inches. After the circuit board 12 has moved a distance equal to 50 ep (0.5 inches) from the position of when the gun is pulsed off, spray gun 20 is pulsed on again for 5 ep or 0.05 inches of conveyor movement coats a second section for 1.5 inches plus 0.05 inches of board travel which overlaps the first section. Then, the gun is pulsed off for 50 ep and the cycle or sequence repeats itself until the end of the board is sensed by the sensor. Since the side edge of the spray pulse is approximately 1.5 inches in width and since the second spray pulse will be actuated for 0.05 inches, after the start of the first spray pulse, the first and second sections will still overlap by approximately 1.0 inches.

In a fourth example relating to the prior art controller, as shown in FIG. 7D, the encoder remains setup so that conveyor moves 1 inch for every 100 encoder pulses (ep) and the conveyor is set to move at a desired speed, such as for example, 200 ep/sec or two inches per second. The encoder generates an encoder pulse for every 0.01 inches of conveyor movement. The gun is pulsed open for 5 ep or 0.05 inches of conveyor movement. Note, however that the gun is only on for 0.025 sec as compared with 0.050 sec in Example 3. Since the volume of solder flux dispensed by the gun in the same period of time does not change, in Example 4 about one half of the volume of solder flux is coated onto the same length of board as coated onto the board of Example 3 where the board is moving at half the speed of the board in Example 4. The prior art controller continues the sequence by closing the gun for 50 ep or 0.5 inches of board movement. The width of the spray pattern between side edge 24A and 24B is 1.5 inches in width. The width of the coating applied to a first section of the undersurface of the circuit board 12 in this example is thus 1.55 inches. After the circuit board 12 has moved a distance equal to 50 ep (0.5 inches) from the position of when the gun is pulsed off, spray gun 20 is pulsed on again for 5 ep or 0.05 inches of conveyor movement coats a second section for 1.5 inches plus 0.05 inches of board travel which overlaps the first section. Then, the gun is pulsed off for 50 ep and the cycle or sequence repeats itself until the end of the preprogramed distance. Since the side edge of the spray pulse is approximately 1.5 inches in width and since the second spray pulse will be actuated for 0.05 inches, after the start of the first spray pulse, the first and second sections will still overlap by approximately 1.0 inches. However because of the increased speed of the conveyor, only one half of the amount of solder flux will be coated to the underside of the board.

Another aspect of the first embodiment is the ability to program in the pulsing program a lead distance of a desired number of encoder pulses which represent an additional distance that the circuit board travels before the spray gun is pulsed on. This feature is useful to account for the width of the spray pattern so that the spray does not extend past the leading edge 46 of board 12 as overspray. Also, this feature is useful when several circuit boards 12 are carried on a pallet 70, as illustrated in FIG. 3. Pallet 70 has a front rail 72 and a rear rail 74 and the circuit boards 12 are abutted against each other therebetween. In order that the front rail 72 is not sprayed, the lead distance is programmed into the pulse program so that the gun is not pulsed on until the front rail of pallet 70 moves a number of encoder pulses equal to both the predetermined distance between sensor 56 and the nozzle 22 plus the width of front rail 72. In addition, the pulsing program can include a lag distance of a desired number of encoder pulses which represent the width of rear rail 74. In order that the rear rail 74 is not sprayed, the lag distance is programmed into the pulse program so that gun 20 is not pulsed on when pallet 70 moves a second distance between leading edge 46 and trailing edge 48 of circuit board 12 less the lag distance.

Another feature of the first embodiment is the provision of a minimum trigger distance in encoder pulses. If the sensor 56 turns on or off for the minimum trigger distance, the signal is ignored and does not effect the control function of controller 60. For example, if a circuit board 12 has an open area whose length is less than the minimum trigger distance, the signal from sensor 56 that would indicate the presence of the trailing edge is less than the minimum trigger distance and does not activate the controller 60.

In accordance with a second embodiment of the invention, controller 60 accesses a pulsing program with a pattern control mode from a conventional means, such as a computer 66, through line 68. The pattern control mode pulsing program enables an operator to input a pulsing pattern of a plurality of zones each having a different pulse pattern (period of time that the gun is pulsed on and predetermined number of encoder pulse signals for the length of each zone) to be sprayed on the circuit board. After the pulsing pattern is sprayed, the pulsing pattern repeats itself until the end of the board. While in a typical application the pulsing pattern includes two or three different zones programmed into the pattern control mode pulsing program, it is within the terms of the present invention to program in addition zones the pulsing pattern as required. The pattern control mode pulsing program also enables an operator to input a predetermined number of encoder pulse signals corresponding to a second distance between leading edge 46' and trailing edge 48' of circuit board 12', as shown in FIG. 4. Throughout the specification, primed numbers represent structural elements which are substantially identical to structural elements represented by the same unprimed number.

During the operation of the second embodiment, the control system 26, after having the first distance between the sensor 56 and the nozzle 22 or the forward edge 24A of the spray pattern 24, the selected period of pulse on time and the predetermined number of encoder pulse signals for each plurality of zones A, B, C, as shown in FIG. 4, of the pulsing pattern already inputted into the pulsing program as mentioned above, is activated when conveyor 14 moves a circuit board 12' under sensor 56. Sensor 56 is then activated to sense the leading edge 46' of the circuit board 12' carried on conveyor 14 and to output a sensor signal into line 58. The sensor signal is inputted into controller 60 which in response thereto outputs a first trigger signal for pulsing the spray gun 20 on for a first period of time during the movement of circuit board 12' for a first predetermined number of encoder pulses corresponding to the length of the first zone A, then a second trigger signal for pulsing the spray gun 20 on for a second period of time during the movement of the circuit board for a second predetermined number of encoder pulses corresponding to the length of the second zone B, then a third trigger signal for pulsing the spray gun 20 on for a third period of time during the movement of the circuit board for a third predetermined number of encoder pulses corresponding to the length of the third zone C. Then the program repeats the sequence and applies the pulsing pattern for the next circuit board passing under sensor 56.

Another aspect of the second embodiment is the ability to program in the pulsing program a lead distance of a desired number of encoder pulses which represent an additional distance that circuit board 12' travels before spray gun 20 is pulsed on. This feature is useful to account for the width of the spray pattern so that the spray does not cross the leading edge 46' of the board 12' as overspray. Also, this feature is useful when several circuit boards 12' are carried on a pallet 70', as illustrated in FIG. 5. Pallet 70' has a front rail 72' and a rear rail 74' and the circuit boards 12' are abutted against each other therebetween. In order that front rail 72' is not sprayed, the lead distance is programmed into the pattern control mode pulsing program so that the spray gun is not pulsed on until the front rail 72' of pallet 70' moves a number of encoder pulses equal to both the predetermined distance from the sensor 56 to nozzle 22 plus the width of the front rail. In addition, the pattern control mode pulsing program can include a lag distance of a desired number of encoder pulses which represent the width of rear rail 74'. In order that the rear rail 74' is not sprayed, the lag distance is programmed into the pulse program so that the gun is not pulsed on when pallet 70' moves a second distance between the leading edge 46' and trailing edge 48' of circuit board 12' less the lag distance.

Another feature of the pattern control mode pulsing program is the provision of a minimum trigger distance in encoder pulses. If sensor 56 turns on or off for the minimum trigger distance, the signal is ignored and does not effect the control function of controller 60. For example, if the circuit boards 12' are loaded on pallet 70' so that a vacant space 76 exists between the trailing edge 48' of circuit board 12' and the leading edge 46' of the adjacent circuit board, as shown in FIG. 6, the controller does not stop pulsing the gun on because the length of the vacant space is less than the minimum trigger distance. In another example, when the width of the rear rail 74' is less than the minimum trigger distance, the signal from sensor 56 is less than the minimum trigger distance and does not activate the controller 60.

It is apparent that there has been provided in accordance with this invention a system and method for applying a flux coating to a circuit board that satisfy the objects, means and advantages set forth hereinbefore. According to one embodiment, a control system operates a spray gun to apply an even coating of flux to a circuit board or a plurality of different length circuit boards irrespective of the speed that the circuit board(s) move through the coating chamber. In a second embodiment, the control system pulses the spray gun on and off with a pulsing pattern that coats a plurality of zones of a circuit board with spray patterns of flux of different length and thickness.

While the invention has been described in combination with embodiments thereof, it is evident that many alternatives, modifications, and variations will be apparent to those skilled in the art in light of the foregoing teachings.

Accordingly, the invention is intended to embrace all such alternatives, modifications and variations as fall within the spirit and scope of the appended claims.

We claim:

1. A system for controlling the application of a coating material onto a substrate, said system comprising:

a conveyor for transporting said substrate in a direction of travel;

a spray gun emitting a spray pattern of coating material for application to said substrate;

an encoder disposed adjacent said conveyor to output encoder pulse signals corresponding to the distance of travel of said conveyor;

a sensor disposed adjacent said conveyor and upstream of said spray gun a first distance to sense said substrate on said conveyor measure the unknown length of said substrate and output a sensor signal indicative of a length of said substrate; and a controller operatively connected to said spray gun, said encoder and said sensor, said controller being activated in response to said sensor signal to output trigger signals for pulsing said spray gun on to apply material at different rates to different regions of said substrate.

2. A system for controlling the application of a coating material onto a substrate having a leading edge, a trailing edge and being of an unknown length, said system comprising:

a conveyor for transporting said substrate in a direction of travel;

a spray gun disposed adjacent said conveyor, said spray gun emitting a spray pattern of coating material for application to said substrate;

an encoder disposed adjacent said conveyor for outputting a number of pulse signals correlated to the distance of travel of said conveyor;

a sensor disposed adjacent to said conveyor and upstream of said spray gun a first distance to sense said substrate on said conveyor and measure the unknown length of said substrate and output a sensor signal corresponding to said unknown length of said substrate; and a controller operatively connected to said spray gun, said encoder and said sensor, said controller being activated in response to said sensor signal to output a recurring sequence of at least two patterns of trigger signals after the leading edge of said substrate moves said first distance, the first of said patterns of trigger signals pulsing said spray gun on for a first period of time beginning when said substrate travels a second distance equal to a first number of encoder pulse signals and the second of said at least two patterns of trigger signals pulsing said spray gun on for a second period of time when said substrate travels a second distance equal to a second number of encoder pulse signals counted from the last of said first number of encoder pulses.

3. A system for controlling the application of a coating material to a substrate having a leading edge, a trailing edge and being of an unknown length, said system comprising:

a conveyor for transporting said substrate in a direction of travel;

a spray gun disposed adjacent to said conveyor, said spray gun emitting a spray pattern of coating material for application to said substrate;

an encoder disposed adjacent said conveyor for outputting a number of pulse signals correlated to the distance of travel of said conveyor;

a sensor disposed adjacent to said conveyor and upstream of said spray gun a first distance for measuring the unknown length of said substrate on said conveyor and for outputting a length signal corresponding to said unknown length of said substrate; and a controller operatively connected to said spray gun, said encoder and said sensor, said controller receiving said length signal from said sensor and said pulse signals from said encoder and outputting to said spray gun a first and second plurality of trigger signals, said first plurality of trigger signals being outputted during a time period correlated to the length of a first portion of said substrate and starting after said leading edge of said substrate moves said first distance, each of said first plurality of trigger signals starting after said substrate moves a first predetermined distance and lasting a first predetermined length of time, and said second plurality of trigger signals being outputted during a time period correlated to the length of a second portion of said substrate and starting after said leading edge of said substrate moves a distance equal to said first portion of said substrate, each of said second plurality of trigger signals starting after said substrate moves a second predetermined distance and lasting a second predetermined length of time.

4. The system as set forth in claim 3 wherein said first predetermined length of time is equal to said second predetermined length of time and said first predetermined distance is not equal to said second predetermined distance.

5. The system as set forth in claim 3 wherein said first predetermined length of time is not equal to said second predetermined length of time and said first predetermined distance is equal to said second predetermined distance.

6. The system as set forth in claim 3 wherein said first predetermined length of time is not equal to said second predetermined length of time and said first predetermined distance is not equal to said second predetermined distance.

7. The system of claim 3 wherein said spray gun is on only during the receipt of each of said first and second plurality of trigger signals.

8. The system of claim 3 wherein said first plurality of trigger signals start after said leading edge of said substrate moves said first distance plus an additional distance.

9. The system of claim 8 wherein said second plurality of trigger signals end after said leading edge of said substrate moves a distance equal to said length of said substrate minus an additional distance.

10. The system of claim 3 wherein said first plurality of trigger signals end after said leading edge of said substrate moves a distance equal to said length of said first portion plus an additional distance.

11. The system of claim 3 wherein said second plurality of trigger signals end after said leading edge of said substrate moves a distance equal to said length of said substrate minus an additional distance.

* * * * *